United States Patent [19]

Chung

[11] Patent Number: 5,014,352

[45] Date of Patent: May 7, 1991

[54] FREQUENCY DIFFERENCE DETECTOR (FDD) AND A CARRIER MODULATED RECEIVER INCLUDING SUCH A FDD

[75] Inventor: Kah-Seng Chung, Bull Creek, Australia

[73] Assignee: U.S. Philips Corporation, New York, N.Y.

[21] Appl. No.: 249,630

[22] Filed: Sep. 23, 1988

[30] Foreign Application Priority Data

Oct. 5, 1987 [GB] United Kingdom ............. 8723312

[51] Int. Cl.$^5$ .............................................. H04B 1/16
[52] U.S. Cl. ................................ 455/314; 455/209; 455/214; 455/302
[58] Field of Search ............... 455/205, 207, 209, 214, 455/336, 337, 302-306, 314, 315; 329/50; 375/100, 102

[56] References Cited

U.S. PATENT DOCUMENTS

| | | | |
|---|---|---|---|
| 3,160,815 | 12/1964 | Ford et al. | 455/209 |
| 4,200,871 | 4/1980 | Roeber et al. | 342/78 |
| 4,620,160 | 10/1986 | Waggener | 329/104 |
| 4,677,690 | 6/1987 | Reed | 455/207 |
| 4,713,563 | 12/1989 | Marshall et al. | 307/490 |
| 4,736,390 | 4/1988 | Ward et al. | 455/315 |
| 4,736,392 | 4/1988 | Kammeyer et al. | 375/80 |
| 4,766,392 | 8/1988 | Moore | 329/124 |

Primary Examiner—Reinhard J. Eisenzopf
Assistant Examiner—Edward Urban
Attorney, Agent, or Firm—David R. Treacy

[57] ABSTRACT

A frequency difference detector (FDD) of a balanced quadricorrelator type comprises a front end formed by quadrature related first and second mixers (12, 14) in which an input signal is mixed down to base band. After the in-band signal components have been selected by low pass filter (18, 20) the signals VI1, VQ1 are applied to third and fourth mixers (30, 32). In applying these signals VI1 and VQ1, they are differentiated by one or more orders and applied to respective first inputs of the third and fourth mixers (30, 32) and to respective second inputs of the fourth and third mixers. When differentiating the signals VI1 and VQ1, it is necessary that there is one order of difference between the signals at the first and second inputs of each of the third and fourth mixers (30, 32). The outputs of the third and fourth mixers are applied to a subtracting circuit (38) which provides a frequency difference output signal. The FDD disclosed can form part of an FM demodulator for a carrier modulated receiver.

17 Claims, 3 Drawing Sheets

FREQUENCY DIFFERENCE DETECTOR (FDD) AND A CARRIER MODULATED RECEIVER INCLUDING SUCH A FDD

The present invention relates to a frequency difference detector (FDD) having particular, but not exclusive, application in carrier modulated receivers. The present invention also relates to a carrier modulated receiver including such a FDD.

In such receivers it is essential for the local oscillator frequency to track the transmitted carrier frequency so that the difference between the two frequencies is set to within a tolerable accuracy. Automatic frequency control (AFC) circuits are normally used for deriving a measure of this difference in frequency and for automatically adjusting the local oscillator. Consequently a frequency difference detector forms the heart of all AFC loops and can be realised in various forms. The particular FDD of interest in the present application is termed a balanced quadricorrelator. A known type of balanced quadricorrelator is shown in FIG. 3 of an article "Properties of Frequency Difference Detectors" by Floyd M Gardner, IEEE Transactions on Communications, Vol COM 33 No. 2, February 1985, Pages 131 to 138. The known circuit comprises quadrature related, first and second mixers in which an input signal is mixed down to I and Q baseband signals. Low pass filters are provided in the output circuits of the first and second mixers in order to select the in-band signal components. The output of one of the low pass filters is (1) differentiated and applied to an input of a third mixer and (2) applied without differention to an input of a fourth mixer. The output of the other of the low pass filters is (1) differentiated and applied to another input of the fourth mixer and (2) applied without differentiation to another input of the third mixer. The outputs of the third and fourth mixers are subtracted from each other to provide a frequency difference signal. It can be shown that the output voltage $V_d$ of such a balanced quadricorrelator is proportional to the frequency difference $\Delta w$ between the transmitted carrier and the local oscillator and is given by $$V_d \alpha E^2 \cdot \Delta\omega$$

where E is the amplitude of the input signal. It is evident from this equation that the detected output voltage is highly sensitive to the amplitude E of the input signal which is a shortcoming of this type of circuit.

This known balanced quadricorrelator has another shortcoming having regard to the fact that a receiver for carrier modulated signals has to be capable of handling a very large range of input signal amplitudes. This shortcoming manifests itself in that an accumulation of DC offsets in the individual circuit functions will give rise to error in the FDD dc output, and this is particularly severe when operating with a weak input signal. Additionally the dynamic range of the third and fourth multipliers will also be curtailed by d.c. offsets accumulated in the preceding circuit stages.

An object of the present invention is to mitigate these shortcomings in balanced quadricorrelator circuits.

According to the present invention there is provided a frequency difference detector comprising a signal input terminal, a local oscillator, first and second mixers, means coupling the first signal input terminal to first inputs of the first and second mixers and the local oscillator to second inputs of the first and second mixers, a 90° phase shifter provided in the signal path to one of the inputs of the first and second mixers whereby the first and second mixers produce first and second orthogonally related outputs, respectively, first and second frequency selecting means provided in the output circuits of the first and second mixers, respectively, a first electrical path connecting the first frequency selecting means to a first input of a third mixer, a second electrical path connecting the first frequency selecting means to a second input of a fourth mixer, a third electrical path connecting the second frequency selecting means to a first input of the fourth mixer, a fourth electrical path connecting the second frequency selecting means to a second input of the third mixer, the first to fourth electrical paths including differential means, the differential means in the first and third electrical paths being one order different than the differential means in the second and fourth electrical paths, and signal subtracting means connected to outputs of the third and fourth mixers.

The present invention is based on the realisation that the shortcomings of the known balanced quadricorrelator circuit can be greatly reduced by blocking any d.c. offset voltages in the signals at the inputs of the third and fourth mixers. Additionally since differentiation of a signal is a high pass function, it has an intrinsic property of blocking any d.c. offset voltages appearing at both the inputs of each of the third and fourth multipliers. Consequently the dynamic range requirement of these two multipliers will not be affected by the accumulated d.c. offsets in the preceding circuits. This in turn minimises the influence of accumulated d.c. offset voltages on the output signal of the FDD. The presence of d.c. offset voltages due to the third and fourth multipliers and the subtracting means may nevertheless appear at the output of the FDD.

If desired at least one differential means in the first and second electrical paths may be common to both said paths and at least one differential means in the third and fourth electrical paths may be common to both said paths. By this means two differential means are saved without affecting adversely the operation of the FDD.

In order to reduce the sensitivity of the output signal from the subtracting means to variations in the input signal, adjustable gain amplifiers may be connected in the signal branches including the first and second mixers. The gain of the adjustable gain amplifiers is altered by an automatic gain control (A.G.C.) circuit.

An embodiment of the a.g.c. circuit comprises fifth and sixth quadrature related mixers for frequency unconverting the non-d.c. signals in the signal paths from the adjustable gain amplifiers, means for summing the outputs from the fifth and sixth mixers, a signal squaring circuit coupled to the summing means, and a low pass filter for passing d.c. and low frequency components in the output from the squaring circuit. The output from the low-pass filter comprises the control signal for the adjustable gain amplifiers. Such an a.g.c. circuit has an advantage in that the dynamic range problem due to accumulated d.c. offsets is avoided.

The FDD made in accordance with the present invention may comprise an FM demodulator for a carrier modulated receiver. Since the output signal from the FDD comprises a cube function then in order to demodulate the output signal it is necessary to obtain the cube root of this function which is not easy to implement.

One means by which the cube root may be obtained digitally is to apply the output of the FDD to an analogue to digital converter, the digital signal therefrom is supplied to a look-up table formed by the cube roots of the said function, and finally the digital value of the cube root is converted to an analogue modulating signal output using a digital to analogue converter.

Using the FDD made in accordance with the present invention as part of an FM demodulator a number of advantages are obtained. These advantages include:

1. As a high pass function (d.c. blocking) is implicit with a differentiator, then this architecture is less sensitive to additional a.c. coupling, if required. The problem of "hole-in-spectrum" in FM demodulation associated with a.c. coupling in known circuits is much reduced. This in turn means that distortion in the recovered audio for analogue FM will be reduced.

2. The balanced structure of the FDD cancels out the influence of gain and phase deviations which are present in any dual branch architecture. This will also lead to an improved audio performance of such an FM demodulator.

The present invention will now be described, by way of example, with reference to the accompanying drawings, wherein.

In the drawings the same reference numerals have been used to indicate the corresponding features.

Figure 1:
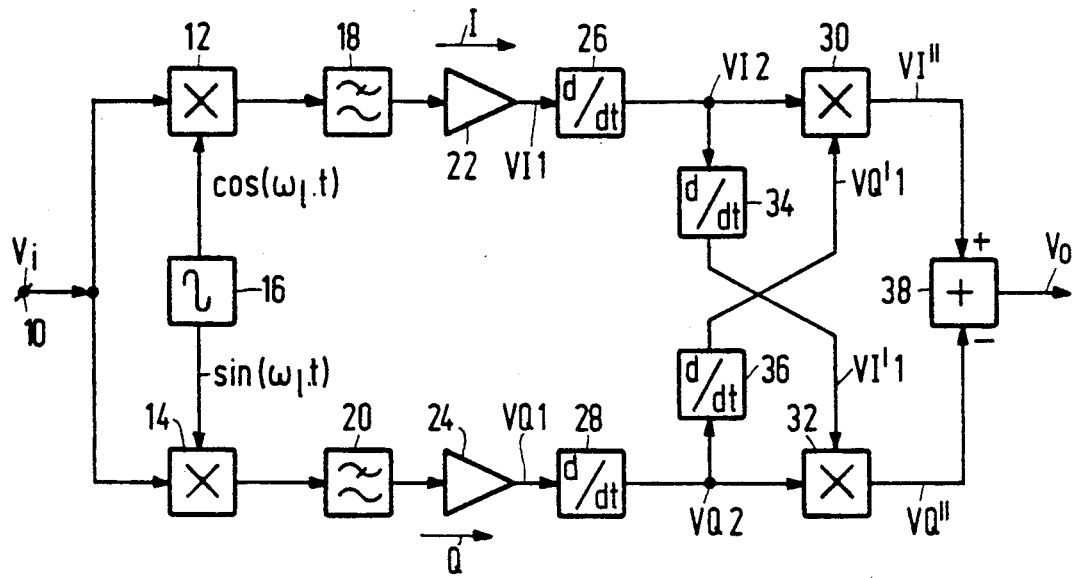
FIG. 1 is a block schematic circuit of one embodiment of a FDD made in accordance with the present invention.

The FDD shown in FIG. 1 comprises a quadrature front end comprising first and second mixers 12, 14 having inputs connected to an input terminal 10 and to a local oscillator. Outputs from the mixers 12, 14 are quadrature related and in the illustrated embodiment this is carried out by phase shifting the local oscillator signal applied to the second mixer 14. Alternatively a 90° phase shifter could be connected between the input terminal 10 and signal input to the first or second mixer. The local oscillator frequency may be the same as or slightly different from the carrier frequency of an input signal $V_i$. Low pass filters 18, 20 select the in-band signal components in the outputs of the first and second mixers 12, 14. The filtered signals have their amplitudes adjusted by amplifiers 22, 24 and produce signals VI1 and VQ1, where I means in-phase and Q means quadrature phase.

The signals VI1 and VQ1 are differentiated once in differential circuits 26, 28, respectively, and applied to first inputs of third and fourth mixers 30, 32 as signals VI2 and VQ2, respectively. These signals VI2 and VQ2 are differentiated in differential circuits 34, 36 and applied as signals VI'1 and VQ'1 to second inputs of the fourth and third mixers 32, 30, respectively. The outputs VI" and VQ" are applied to a subtracting circuit 38 which produces an output signal $V_O$.

By differentiating the signals applied to both inputs of the third and fourth mixers any d.c. offset voltages are blocked because "differentiation" is a high pass function. Thus the dynamic range of these mixers 30, 32 will not be affected by the accumulated offsets in the preceding circuit stages. The only d.c. offset voltages which could appear in the output signal $V_O$ are those due to the mixers 30, 32 and the subtracting circuit 38. It is necessary to ensure that there is one order difference between the differentiated signals applied to the first inputs of the mixers 30, 32 and those applied to the second inputs of the same mixers.

The signals at the various points of FIG. 1 are given as follows:

$$v_i = E \cdot \cos(\omega_i \cdot t)$$

$$VI1 = \frac{E}{2} \cdot \cos(\Delta\omega \cdot t)$$

$$VI2 = -\frac{E}{2} \cdot \Delta\omega \cdot \sin(\Delta\omega \cdot t)$$

$$VI'1 = -\frac{E}{2}\left[\sin(\Delta\omega \cdot t) \cdot \frac{d(\Delta\omega)}{dt} + \Delta\omega^2 \cdot \sin(\Delta\omega \cdot t)\right].$$

$$VQ1 = \frac{E}{2} \cdot \sin(\Delta\omega \cdot t)$$

$$VQ2 = \frac{E}{2} \cdot \Delta\omega \cdot \cos(\Delta\omega \cdot t)$$

$$VQ'1 = \frac{E}{2}\left[\cos(\Delta\omega \cdot t) \cdot \frac{d(\Delta\omega)}{dt} - \Delta\omega^2 \cdot \sin(\Delta\omega \cdot t)\right]$$

$$VI'' = -\frac{E^2}{4}\left[\Delta\omega \cdot \sin(\Delta\omega \cdot t) \cdot \cos(\Delta\omega \cdot t) \cdot \right.$$

$$\left. \frac{d(\Delta\omega)}{dt} - (\Delta\omega)^3 \cdot \sin^2(\Delta\omega \cdot t)\right]$$

$$VQ'' = -\frac{E^2}{4}\left[\Delta\omega \cdot \sin(\Delta\omega \cdot t) \cdot \cos(\Delta\omega \cdot t) \cdot \right.$$

$$\left. \frac{d(\Delta\omega)}{dt} + (\Delta\omega)^3 \cdot \cos^2(\Delta\omega \cdot t)\right]$$

$$V_0 = VI'' - VQ'' = \frac{E^2}{4} \cdot (\Delta\omega)^3 \alpha E^2 (\Delta\omega)^3$$

where E is amplitude and $\omega$ is the frequency difference between the transmitted carrier $\omega_i$, and the local oscillator $\omega_l$, such that $\Delta\omega = (\omega_l - \omega_i)$. The final equation for $V_O$ shows that the output of the FDD is now proportional to $(\Delta\omega)^3$, instead of $(\Delta\omega)$ as with an conventional balanced quadricorrelator. This change in output for a given change in frequency difference $\Delta\omega$ associated with the embodiment of FIG. 1 is much greater and is a desirable characteristic. Such a characteristic reduces the remaining problems of d.c. offsets due to the third and fourth mixers 30, 32 and the subtracting circuit 38.

Figure 2:
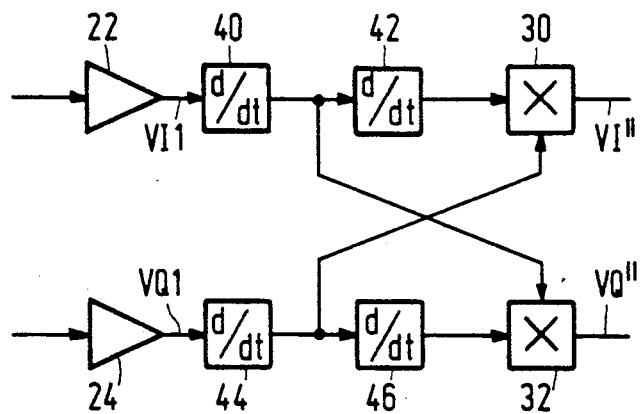
FIGS. 2 to 4 illustrate three other configurations of differential stages to that shown in FIG. 1 and which produce signals of one order difference at the inputs of the third and fourth mixers.

Provided that there is a difference of one differential order between the inputs to each of the third and fourth mixers 30, 32 then various arrangements of differential circuits are possible. FIG. 2 is the converse of FIG. 1 in that there are two differential circuits 40, 42 and 44, 46, respectively, connected to the first inputs of the third and fourth mixers 30, 32 and only one, that is the differential circuit 40 and 44, respectively, connected to the second input of the said mixers 30, 32.

Figure 3:
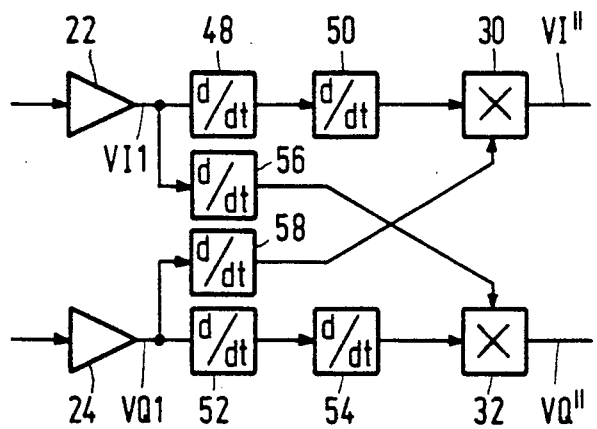
Figure 4:
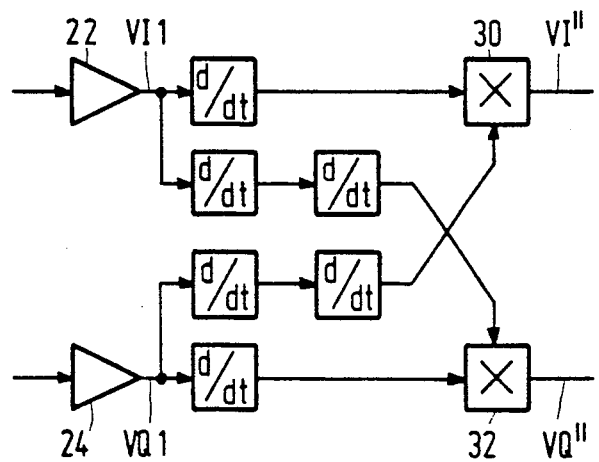

FIGS. 3 and 4 show two alternative arrangements of differential circuits in which each signal path is separate from the others so that there are no differential circuits common to both paths.

In the arrangement shown in FIG. 3 the signals VI1 and VQ1 are differentiated twice in differential circuits 48, 50 and 52, 54, respectively, before being applied to the first inputs of the mixers 30, 32. The same signals VI1 and VQ1 differentiated once in differential circuits 56 and 58, respectively, before being applied to the second inputs of the fourth and third mixers 32, 30, respectively.

The arrangement shown in FIG. 4 is the converse of that shown in FIG. 3 and for this reason it is considered that a detailed description is unnecessary.

Provided that there is a difference of one differential order between the signals at the first and second inputs of the third and fourth mixers 30, 32 and that there is at least one differential circuit in each signal path then in theory the number of differential circuits in each signal path can be limitless. However having regard to the fact that differentiation is a noise enhancement process then in practice a compromise has to be made having regard to circuit complexity and noise consideration.

Figure 5:
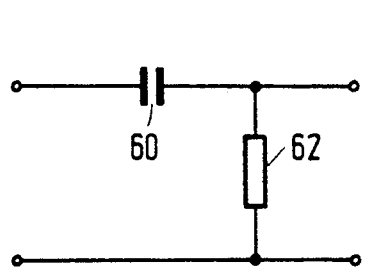
FIG. 5 illustrates approximating a differentiator with a simple high pass capacitance-resistance (CR) network.

FIG. 5 illustrates that a differential circuit can be approximated as a simple capacitance-resistance network formed by a series capacitor 60 and a shunt resistor 62 connected to ground. Since differentiation is a linear function, the differential circuits could be incorporated into the low pass filters 18, 20 (FIG. 1) or the amplifiers 22, 24 (FIG. 1).

Figure 6:
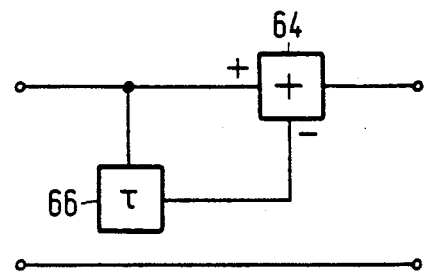
FIG. 6 illustrates approximating a differentiator using a delay element and a subtractor.

FIG. 6 illustrates another embodiment of a differential circuit which is formed by a subtracting circuit 64 having one input connected to receive the signal present in the signal path from the low pass filter 18 or 20 (FIG. 1) and a second input connected to a delay element 66 which provides a delayed version of the signal in the signal path. The delay $\tau$ provided by the element 66 is much less than the period of the highest frequency component in the applied signal.

It will be recalled that the output signal $V_O$ from the subtracting circuit 38 (FIG. 1) contains a term in $E^2$ where E is the input voltage to the FDD. In order to make $V_O$ less sensitive to variations in the input signal $V_i$ automatic gain control (a.g.c.) can be provided.

Figure 7:
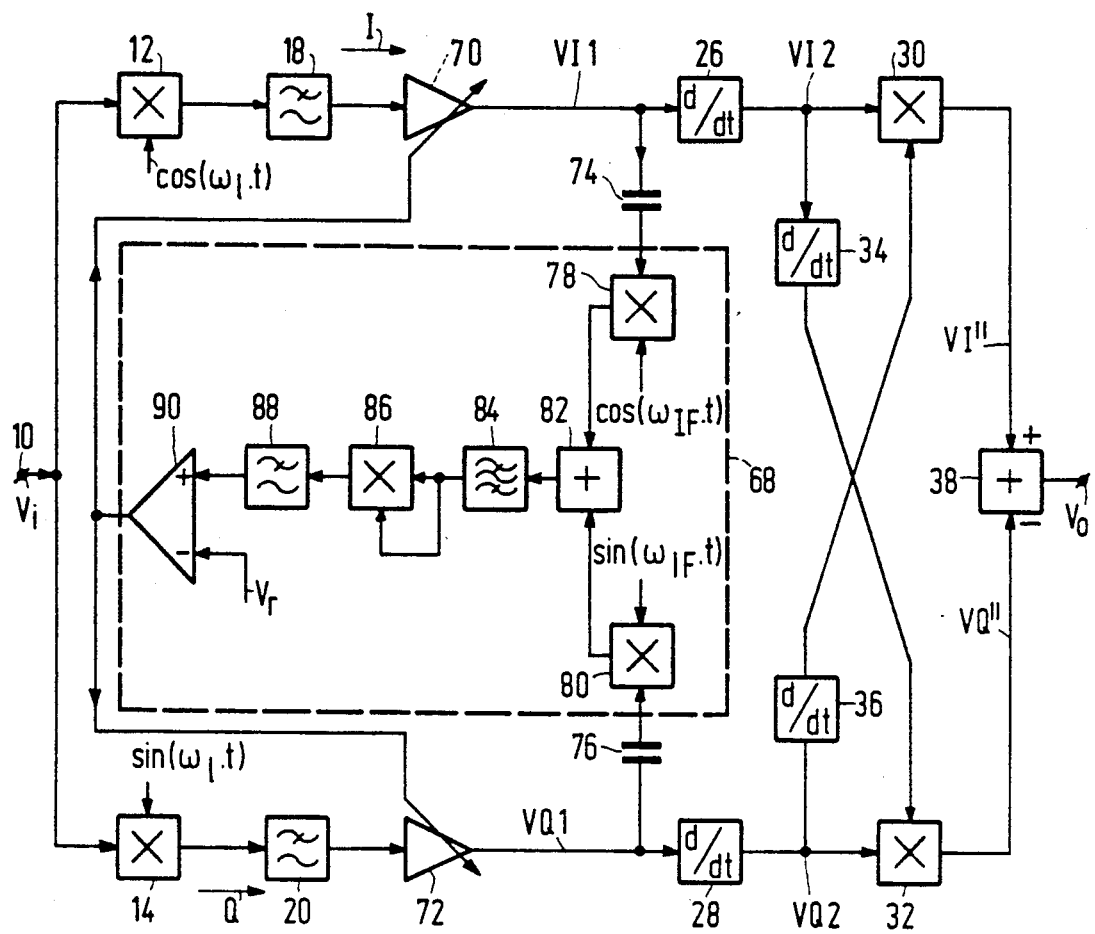
FIG. 7 is a block schematic circuit of a second embodiment of a FDD made in accordance with the present invention.

One embodiment of an a.g.c. system 68 is illustrated in FIG. 7. Adjustable gain amplifiers 70, 72 are provided in the I and Q signal paths at appropriate signal points. The positions shown at the outputs of the low pass filters 18, 20 are only exemplary in order to illustrate the operating principle.

The inputs to the a.g.c. circuit 68 comprise the signals VI1 and VQ1 which are coupled via capacitors 74, 76 to mixers 78, 80 in which they are frequency upconverted to an intermediate frequency (IF) of say 100 KHz which is applied in quadrature to these mixers 78, 80. The outputs of the mixers 78, 80 are combined in a summing circuit 82. The combined signal is bandpass filtered in a filter 84 and the output signal therefrom is squared, that is multiplied by itself, in a multiplier 86. A low pass filter 88 is connected to the multiplier 86 to remove ripple due to modulation and to provide a d.c. signal. The output from the low pass filter 88 is applied to an op-amp 90 to which a reference voltage $V_r$ is applied. The output voltage from the op-amp 90 comprises the d.c. gain control signal for the amplifiers 70, 72. The squaring of the signal from the band pass filter 84 may alternatively have been carried out using a rectifier or a logarithmic amplifier.

The FDD can be used as a demodulator for a FM signal. However since the output signal $V_O$ of the FDD is not linearly related to the change in frequency of the input signal $V_i$, $V_O$ being proportional to $(\Delta\omega)^3$, an extra signal processing step is needed to recover the original modulation.

The equation for the output $V_O$ of the FDD can be rewritten as follows:

$$V_O = k(\Delta\omega)^3 = k(\omega_c + \omega_m)^3$$

where $\omega_c$ is a constant frequency difference, and $\omega_m$ is the instantaneous frequency produced by the modulating signal, and k is a gain constant.

Figure 8:
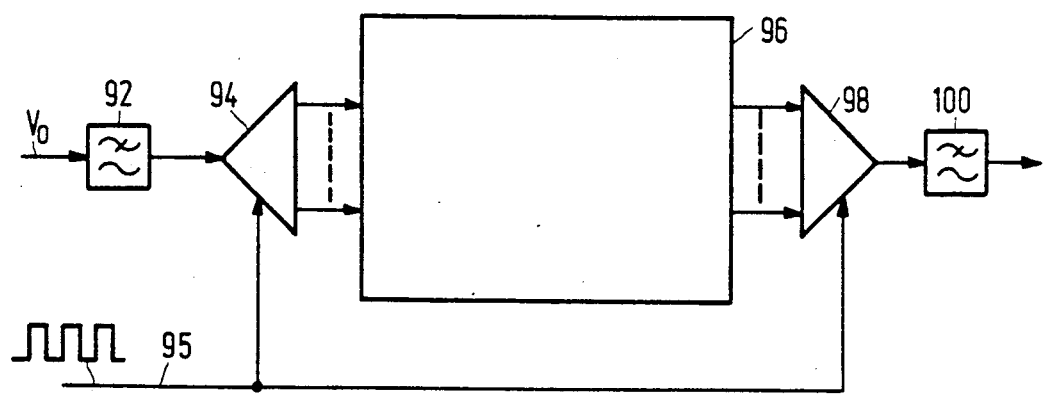
FIG. 8 illustrates a digital demodulator.

The desired modulation can now be recovered by processing $V_O$ of the preceding equation with a cube root function. This can be done digitally or by analogue signal processing. However a cube root function is not an easy function to realise and a digital embodiment will be described with reference to FIG. 8.

The FDD output signal $V_O$ is low pass filtered in a filter 92 and applied to an analogue-to-digital converter 94 which is clocked by clock signals on a line 95. The digitised output is applied to a read only memory 96 which serves as a look-up table for the required cube root function, namely $$[V_0]^{\frac{1}{3}} = Exp\left[\frac{\text{sign }(V_0)}{3} \cdot \ln(|V_0|)\right]$$

The output of the ROM 96 is applied to a digital to analogue converter 98 which provides an analogue cube root signal which is low pass filtered in a filter 100 to provide an output formed by the modulating signal.

The use of the described FDD as an FM demodulator provides two advantages over conventional dual branch architecture thereby reducing the output distortion. These two advantages are:

(1) The problem of "hole-in-spectrum" caused by a.c. coupling is avoided.

(2) The cross-coupling of the two branches suggests that deviations in gain and phase of the two branches could be balanced-out thus reducing distortion and interference in the audio output caused by these imperfections.

From reading the present disclosure, other modifications will be apparent to persons skilled in the art. Such modifications may involve other features which are already known in the design, manufacture and use of FDDs and carrier modulated receivers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not mitigates any or all of the same technical problems as does the present invention. The applicants hereby give notice that new claims may be formulated to such features and/or combinations of such features during the prosecution of the present

What is claimed is:

1. A frequency difference detector comprising:
    a first signal input terminal, a local oscillator, and first and second mixers,
    means coupling the first signal input terminal to first inputs of the first and second mixers and the local oscillator to second inputs of the first and second mixers,
    a 90° phase shifter provided in the signal path to one of the inputs of the first and second mixers whereby the first and second mixers produce first and second orthogonally related outputs, respectively,
    first and second frequency selecting means provided in the output circuits of the first and second mixers, respectively, for passing respective in-band signal components in a selected frequency band,
    a first electrical path connecting the first frequency selecting means to a first input of a third mixer, a second electrical path connecting the first frequency selecting means to a second input of a fourth mixer, a third electrical path connecting the second frequency selecting means to a first input of the fourth mixer, and a fourth electrical path connecting the second frequency selecting means to a second input of the third mixer, and
    signal subtracting means connected to outputs of the third and fourth mixers,
    wherein the first to fourth electrical paths include differential means, the differential means in two of said paths being of a lower order than the differential means in the other two paths, the differential means in the first and third electrical paths being a same order, said differential means of lower order in one of said paths including a differentiator arranged such that, at frequencies within said selected frequency band, said differentiator provides an output signal $-\frac{1}{2}E(\Delta\omega)\sin(\Delta\omega)t$ in response to a signal $\frac{1}{2}E\cos(\Delta\omega)t$.

2. A detector as claimed in claim 1, wherein at least one differential means in the first and second electrical paths is common to both said paths and at least one differential means in the third and fourth electrical paths is common to both said paths.

3. A detector as claimed in claim 2, wherein each of the differential means comprises a high pass capacitor-resistor network.

4. A detector as claimed in claim 2, wherein each of the differential means comprises a subtractor having first and second inputs, the first input for receiving a currently supplied signal, a delay element having an input for receiving the currently supplied signal to the first input and an output connected to the second input.

5. A frequency difference detector comprising:
    a first signal input terminal, a local oscillator, and first and second mixers,
    means coupling the first signal input terminal to first inputs of the first and second mixers and the local oscillator to second inputs of the first and second mixers,
    a 90° phase shifter provided in the signal path to one of the inputs of the first and second mixers whereby the first and second mixers produce first and second orthogonally related outputs, respectively,
    first and second frequency selecting means provided in the output circuits of the first and second mixers, respectively, for passing respective in-band signal components in a selected frequency band,
    a first electrical path connecting the first frequency selecting means to a first input of a third mixer, a second electrical path connecting the first frequency selecting means to a second input of a fourth mixer, a third electrical path connecting the second frequency selecting means to a first input of the fourth mixer, and a fourth electrical path connecting the second frequency selecting means to a second input of the third mixer, and
    signal subtracting means connected to outputs of the third and fourth mixers,
    wherein the first to fourth electrical paths include differential means, the differential means in the first and third electrical paths being one order different from the differential means in the second and fourth electrical paths, and
    the detector further comprises first and second adjustable gain amplifiers provided in signal branches including the first and second mixers, respectively, and an automatic gain control (a.g.c.) circuit having an output connected to the adjustable gain amplifiers.

6. A detector as claimed in claim 5, wherein the a.g.c. circuit has first and second inputs capacitively coupled to the respective signal branches.

7. A detector as claimed in claim 6, wherein the a.g.c. circuit comprises fifth and sixth mixers having first inputs connected respectively to the first and second a.g.c. circuit inputs, and second inputs for receiving quadrature related intermediate frequency carrier signals, summing means for summing the outputs of the fifth and sixth mixers, a signal squaring means coupled to the output of the summing means and low pass filtering means for passing the d.c. component of the output signal from the squaring means, which d.c. component comprises a control signal for the adjustable gain amplifiers.

8. A carrier modulated receiver having an FM demodulator including the frequency difference detector (FDD) as claimed in claim 7.

9. A receiver as claimed in claim 8, wherein the output signal of the FDD comprises a cube function and wherein the modulating signal is recovered by taking the cube root of the said function.

10. A receiver as claimed in claim 9, wherein the output of the FDD is applied to a digital cube root circuit comprising and analogue to digital converter having outputs connected to a look-up table containing cube roots of the said function, and a digital to analogue converter coupled to the look-up table and having an output for the modulating signal.

11. A carrier modulated receiver having an FM demodulator including a frequency difference detector, said detector comprising:
    a first signal input terminal, a local oscillator, and first and second mixers,
    means coupling the first signal input terminal to first inputs of the first and second mixers and the local oscillator to second inputs of the first and second mixers,
    a 90° phase shifter provided in the signal path to one of the inputs of the first and second mixers whereby the first and second mixers produce first and second orthogonally related outputs, respectively,
    first and second frequency selecting means provided in the output circuits of the first and second mixers, respectively, for passing respective in-band signal components in a selected frequency band, a first electrical path connecting the first frequency selecting means to a first input of a third mixer, a second electrical path connecting the first frequency selecting means to a second input of a fourth mixer, a third electrical path connecting the second frequency selecting means to a first input of the fourth mixer, and a fourth electrical path connecting the second frequency selecting means to a second input of the third mixer, and signal subtracting means connected to outputs of the third and fourth mixers, wherein the first to fourth electrical paths include differential means, the differential means in two of said paths being of a lower order than the differential means in the other two paths, the differential means in the first and third electrical paths being a same order, said differential means of lower order in one of said paths including a differentiator arranged such that, at frequencies within said selected frequency band, said differentiator provides an output signal $-\frac{1}{2}E(\Delta\omega)\sin(\Delta\omega)t$ in response to a signal $\frac{1}{2}E\cos(\Delta\omega)t$.

12. A receiver as claimed in claim 11, wherein the output signal of the FDD comprises a cube function and wherein the modulating signal is recovered by taking the cube root of the said function.

13. A receiver as claimed in claim 12, wherein the output of the FDD is applied to a digital cube root circuit comprising an analogue to digital converter having outputs connected to a look-up table containing cube roots of the said function, and a digital to analogue converter coupled to the look-up table and having an output for the modulating signal.

14. A receiver as claimed in claim 11, further comprising first and second adjustable gain amplifiers provided in signal branches including the first and second mixers, respectively, and an automatic gain control (a.g.c.) circuit having an output connected to the adjustable gain amplifiers.

15. A receiver as claimed in claim 14, wherein the a.g.c. circuit has first and second inputs capacitively coupled to the respective signal branches.

16. A receiver as claimed in claim 15, wherein the output signal of the FDD comprises a cubic function of the frequency difference and the modulating signal is recovered by taking the cube root of said function.

17. A receiver as claimed in claim 16, wherein the output of the FDD is supplied through a digital cube root circuit comprising an analog-to-digital converter having outputs connected to a look-up table containing cube roots of said function, and a digital-to-analog converter coupled to the look-up table and having an output for the modulating signal.

* * * * *